(12) United States Patent
Li et al.

(10) Patent No.: US 11,750,213 B1
(45) Date of Patent: Sep. 5, 2023

(54) TRAIN-LINKING LOSSLESS COMPRESSOR OF NUMERIC VALUES

(71) Applicant: Hong Kong Applied Science and Technology Research Institute Company Limited, Hong Kong (HK)

(72) Inventors: Hailiang Li, Hong Kong (HK); Yan Huo, Hong Kong (HK); Tao Li, Hong Kong (HK)

(73) Assignee: Hong Kong Applied Science and Technology Research Institute Company Limited

(*) Notice: Subject to any disclaimer, the term of this patent is extended or adjusted under 35 U.S.C. 154(b) by 0 days.

(21) Appl. No.: 17/899,777

(22) Filed: Aug. 31, 2022

(51) Int. Cl.
*H03M 7/30* (2006.01)
*H03M 7/40* (2006.01)

(52) U.S. Cl.
CPC ........... *H03M 7/60* (2013.01); *H03M 7/4006* (2013.01); *H03M 7/4031* (2013.01)

(58) Field of Classification Search
CPC ..... H03M 7/60; H03M 7/4006; H03M 7/4031
USPC ...................................... 708/203; 341/50–51
See application file for complete search history.

(56) References Cited

U.S. PATENT DOCUMENTS

| | | | | |
|---|---|---|---|---|
| 5,467,087 | A * | 11/1995 | Chu ..................... | H03M 7/3086 341/86 |
| 6,819,271 | B2 * | 11/2004 | Geiger .................... | H03M 7/40 341/51 |
| 2020/0143226 | A1 | 5/2020 | Georgiadis | |

FOREIGN PATENT DOCUMENTS

| | | |
|---|---|---|
| CN | 110943744 A | 3/2020 |
| CN | 111107366 A | 5/2020 |
| CN | 112399479 A | 2/2021 |
| CN | 113159267 A | 7/2021 |
| WO | WO2021060758 A | 4/2021 |

OTHER PUBLICATIONS

ISR and Written Opinion, PCT/CN2022/118537, dated May 13, 2023.

* cited by examiner

*Primary Examiner* — Khai M Nguyen
(74) *Attorney, Agent, or Firm* — Stuart T. Auvinen; gPatent LLC

(57) ABSTRACT

A train-linking lossless data compressor examines a block of data and uses a same coder to generate a same code when all data values in the input block are identical. When the input data is not all the same value, then a Gaussian coder, a Laplace coder, and a delta coder are activated in parallel. The three compressed code lengths are compared and the smallest code length is output as the compressed code when it is smaller than a copy code length. The copy code is a tag followed by copying all the data in the input block. When the smallest of the three compressed code lengths is larger than the copy code length, the file is not compressible, and the copy code is output. No frequency table is required so latency is low. The delta coder subtracts data values from an average value of the last data block.

20 Claims, 9 Drawing Sheets

| TAG 42 | CODE HDR 44 | CODE VALUE 46 | ... | CODE HDR 44 | CODE VALUE 46 |
|---|---|---|---|---|---|
| BYTE1 | | | | | BYTE8 |

| TAG 42 | CODE TYPE |
|---|---|
| 000 | SAME CODING |
| 001 | COPY CODING |
| 01 | GAUSSIAN CODING |
| 10 | LAPLACE CODING |
| 11 | DELTA CODING |

FIG. 7

GAUSSIAN CODING

| DATA (D) RANGE | CODE HDR 44 | CODE VALUE 46 | CODE LENGTH | DATA VALUE CODING |
|---|---|---|---|---|
| 0 | 000 | NUL | 3 | |
| 1-4 | 001 | XX | 5 | XX=D-1 |
| 5-8 | 010 | XX | 5 | XX=D-5 |
| 9-16 | 011 | XXX | 6 | XXX=D-9 |
| 17-24 | 100 | XXX | 6 | XXX=D-17 |
| 25-40 | 101 | XXXX | 7 | XXXX=D-25 |
| 41-72 | 110 | XXXXX | 8 | XXXXX=D-41 |
| 73-255 | 111 | XXXXXXXX | 11 | XXXXXXXX=D-73 |

LAPLACE CODING 52

| DATA (D) RANGE | CODE HDR 44 | CODE VALUE 46 | CODE LENGTH | DATA VALUE CODING |
|---|---|---|---|---|
| 0 | 0 | NUL | 1 | |
| 1-2 | 01 | X | 3 | X=D-1 |
| 3-6 | 011 | XX | 5 | XX=D-3 |
| 7-14 | 0111 | XXX | 7 | XXX=D-7 |
| 15-30 | 01111 | XXXX | 9 | XXXX=D-15 |
| 31-62 | 011111 | XXXXX | 11 | XXXXX=D-31 |
| 63-126 | 0111111 | XXXXXX | 13 | XXXXXX=D-63 |
| 127-254 | 01111111 | XXXXXXX | 15 | XXXXXXX=D-127 |
| 255 | 11111111 | NUL | 8 | |

FIG. 9

TRAIN-LINKING LOSSLESS COMPRESSOR OF NUMERIC VALUES

FIELD OF THE INVENTION

This invention relates to data-compression systems, and more particularly to data compressors using multiple compression methods by train-linking blocks together.

BACKGROUND OF THE INVENTION

Data can be compressed using lossy or lossless methods. Image data such as videos often use lossy compression since loss of visual data may not be especially noticeable. Other data is not loss tolerant, so lossless data compression is used.

Neural Networks use weights for nodes within the network. The network topology and connectivity can be defined by a feature map. These weights and feature maps can be quite large for deep neural networks and convolutional neural networks. Neural network weights and feature maps may be compressed before storage or transmission. Since the computation results may be altered by data compression losses, lossless data compression is desirable for neural networks.

FIG. 1 shows a neural network that has its weights and feature maps compressed before storage or transmission. Neural network 104 can be a Graphics Processing Unit (GPU) or a specialized neural network processor. Neural network 104 may have been trained and its weights and feature maps adjusted to be optimized for a particular problem or data set. These weights and feature maps may be backed up or stored in memory 102.

However, memory 102 may be remote from neural network 104, such as when neural network 104 is on a portable device and memory 102 is cloud storage. The connection between neural network 104 and memory 102 may be limited in bandwidth. Compressor 100 can compress the weights and feature maps from neural network 104 using lossless compression, and the compressed data can be sent to memory 102. The amount of memory required in memory 102 for storage can be reduced, as well as the bandwidth consumed for transmission.

Compressed weights and feature maps stored in memory 102 may be transmitted over network links to a local device that includes compressor 100, which decompresses the weights and feature maps and loads them into neural network 104 to configure neural network 104 for a specific processing task.

Some data blocks may be so random or unstructured that it poorly compresses. It is better not to attempt compression of such data blocks since the compressed data may be larger than the original data. Other data blocks may be easily compressible, such as blocks containing all zeros.

Classic lossless compression algorithms include winzip, winrar, and 7z. These compressors often have both run-length coding and entropy coding. Run-length coding suffers from a large search window which can create a large bottleneck. Entropy coding such as Huffman coding, arithmetic coding, and Finite State Entropy (FSE) coding may require a symbol frequency table. This symbol frequency table may be created or populated during compression and transmitted along with the compressed data. This overloaded symbol frequency table is an overhead that consumes bandwidth and, in some cases, reduces compression efficiency.

Parallel implementations can be difficult with such classical two-stage encoding systems using both run-length and entropy coding. Latency can be long.

What is desired is a lossless compression system that does not use a symbol frequency table. A compressed data stream without an overloaded symbol frequency table is desired. A lossless data compressor with low latency and that permits parallel implementation is desirable. Lossless data compression that partially considers the data structure so as to be very efficient for all-zero blocks and blocks with small data variations is also desirable. Lossless data compression that refers back to the prior block to link the current block to the prior block is desirable.

BRIEF DESCRIPTION OF THE DRAWINGS

FIG. 6 shows encoded compressed data for Gaussian and Laplace coding.

FIG. 7 is a table of tags for coding.

FIG. 8 is a table showing Gaussian coding.

FIG. 9 is a table showing Laplace coding.

DETAILED DESCRIPTION

The present invention relates to an improvement in data compression. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
FIG. 1 shows a neural network that has its weights and feature maps compressed before storage or transmission.
Figure 2:
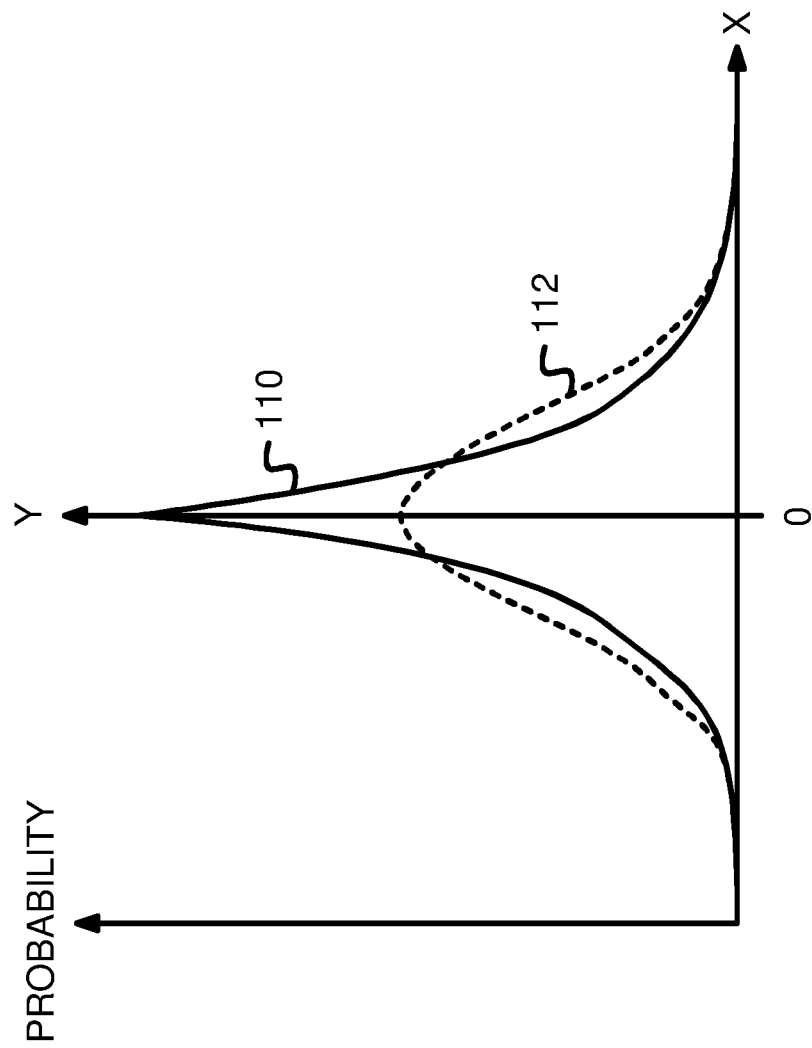
FIG. 2 is a graph of Gaussian and Laplace distributions.

FIG. 2 is a graph of Gaussian and Laplace distributions. Gaussian distribution 112 is a commonly-used model of the distribution of data values or symbols in a block of data to be compressed. Many data blocks are well-compressed using Gaussian compression techniques.

Other data blocks may have a few large values compared to many smaller values. These blocks compress better when Laplace coding methods are used. Laplace distribution 110 often can model these data blocks with large data spikes better than Gaussian distribution 112.

The inventors have realized that Gaussian and Laplace methods complement each other. A data compressor that can select either Gaussian or Laplace codes can better compress a wider range of data sets.

Figure 3:
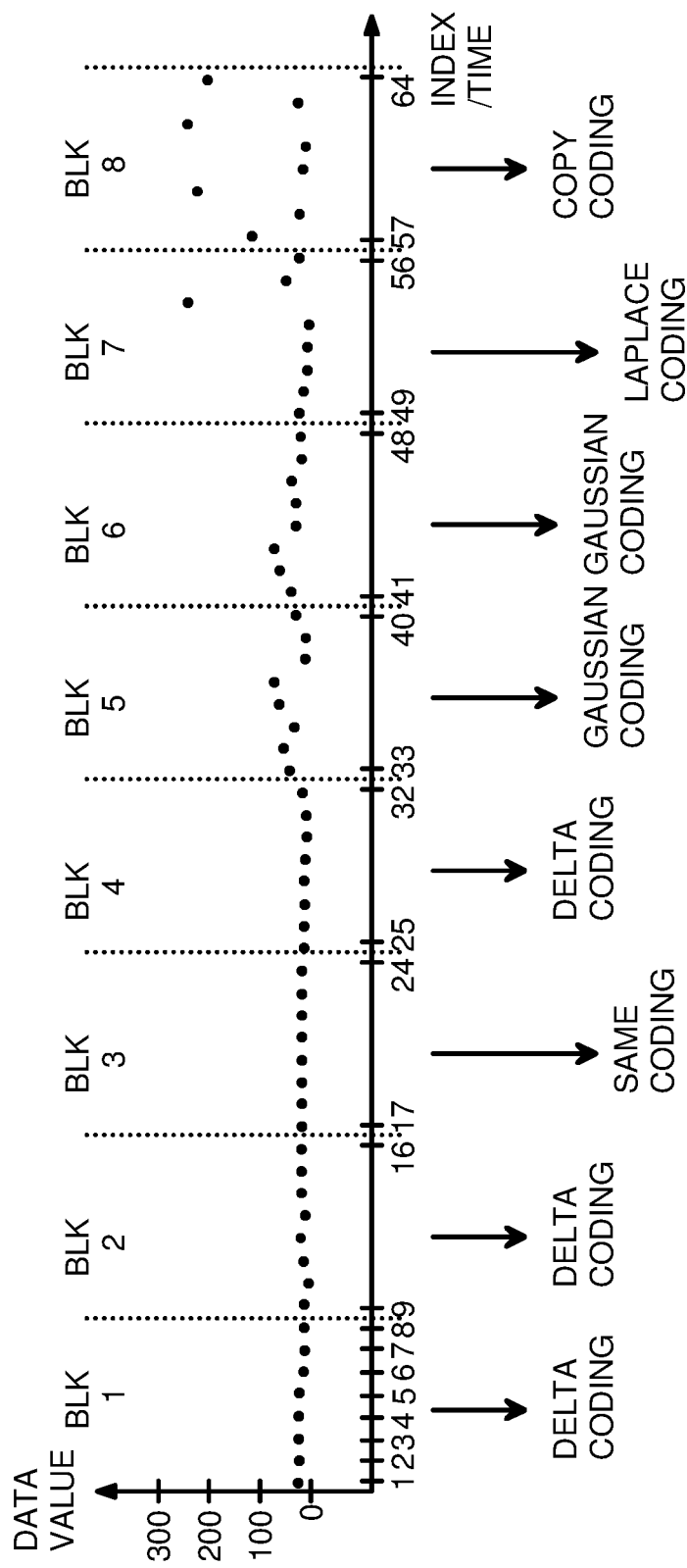
FIG. 3 show a data block with a wide variety of data distributions.

FIG. 3 show a data block with a wide variety of data distributions. The input data block has 64 bytes of data that are arranged into eight blocks of 8 bytes per block. The inventors realize that a wide variety of data distributions can occur in different blocks of data. The inventors use different coding methods for different types of data distributions. Each data block can be encoded using delta coding, same coding, Gaussian coding, LaPlace coding, or copy coding.

The inventors realize that one common kind of data block has very small differences between data values in the block.

The differences or delta among data values in the data block are small. The inventors have developed delta coding to encode these small delta values within the data block to provide for a high compression for these delta blocks. The 8 bytes in data block 1, and the 8 bytes in data block 2, and the eight bytes in data block 4 are each encoded using delta coding.

Delta coding can be easy to implement. The average of the previous block's 8 values is subtracted from each byte in the current block is to generate 8 delta values. These delta values x may be positive or negative, so they may be converted to 8 positive values X using the equations:

$$X=[abs(x)]*2-1 \text{ when } x<0, \text{ or}$$

$$X=(x)*2 \text{ when } x>=0$$

Then the 8 positive delta values X can be encoded using a Gaussian coding method.

When the previous block had al positive values, then when the current block is coded for Gaussian or Laplace, the coder can assume that the current block also has 8 positive values, so the current block is coded as positive Gaussian or Laplace codes. However, when the prior block has both positive and negative values, or when coding the current block as 8 positive values fails or overruns, then the 8 values in the current block may be converted to 8 positive values X using the equations:

$$X=[abs(x)]*2-1 \text{ when } x<0, \text{ or}$$

$$X=(x)*2 \text{ when } x>=0$$

Then the 8 positive values X can be encoded using a Gaussian or Laplace coding method.

The inventors further realize that some data blocks contain only zero values, while other data blocks contain only one non-zero value that is repeated for the whole data block. These data blocks have the same value for all bytes or symbols. A same coder that encodes the same value only once can maximally compress these same-value data blocks. Data block 3 in FIG. 3 is coded using same coding.

Data blocks 5 and 6 can be compressed using Gaussian coding. The data values in these blocks are generally smooth and not small.

Data block 7 has one data byte with a very large value when compared to the other bytes in this block. Laplace coding works well for this kind of data spikes. Data block 7 is compressed using Laplace coding.

The inventors further realize that some data blocks do not fit any of these previously-described data distributions. Some data blocks have wide data fluctuations and do not seem to fit Gaussian or Laplace distributions or codes. These data blocks may even expand when compressed using Gaussian or Laplace codes. These wild data blocks are just not compressible.

The inventors realize it is better to simply copy the data in these blocks rather than to try to compress them. A copy coder can simply copy the data in these blocks. Data block 8 in FIG. 8 has wide data swings and is not compressible using gaussian or LaPlace codes. Instead, copy coding is used on the 8 bytes in data block 8.

Since coding of the current block can depend on the prior block, the coded blocks are linked together similar to cars on a train being coupled together. Thus the inventors refer to this multi-method compression as train-linking coding.

Figure 4:
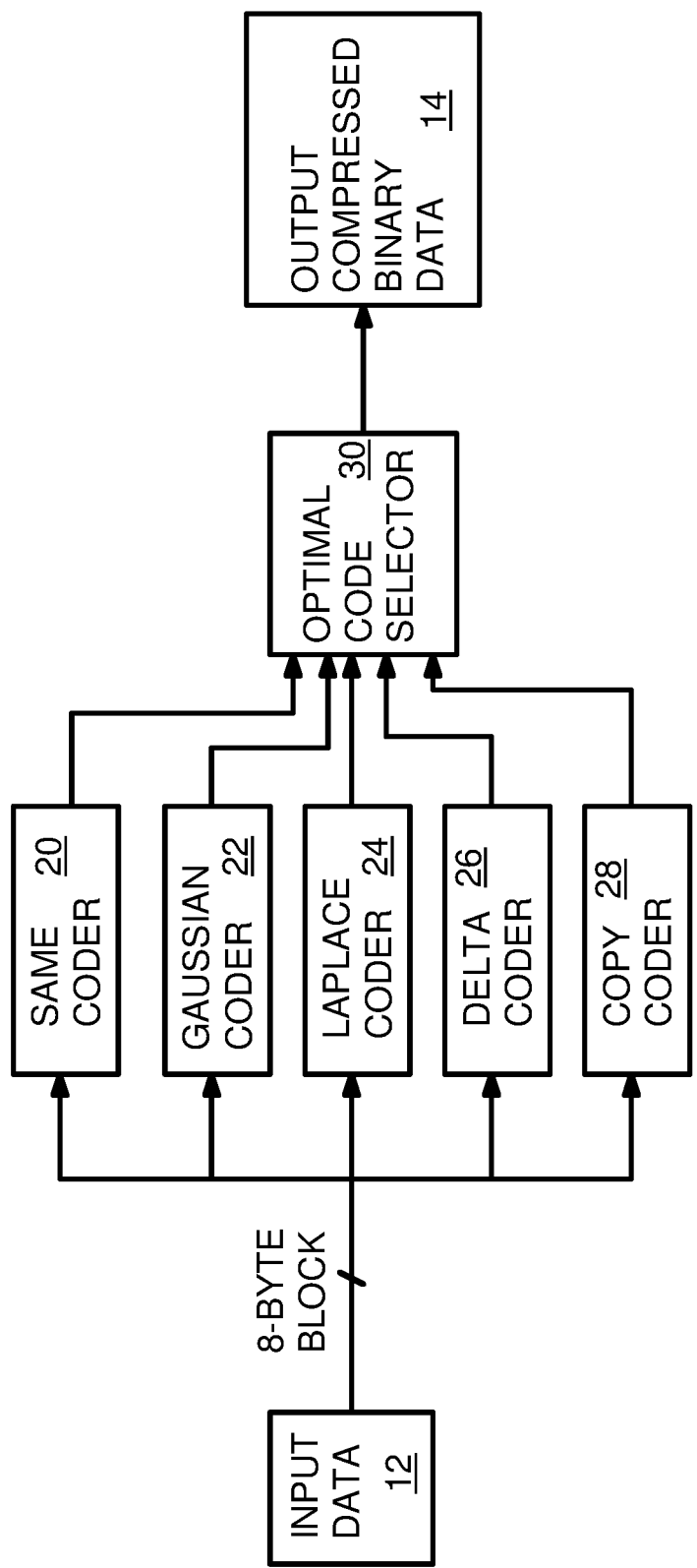
FIG. 4 is a block diagram of a train-linking data compressor.

FIG. 4 is a block diagram of a train-linking data compressor. Input data 12 is a fixed-size block such as an 8-byte block of data. Rather than try to predict which coding provides the best compression for the data, each data block of input data 12 is applied to all 5 coders, and each coder generates a compression code for the data block in input data 12. Then optimal code selector 30 examines the code lengths of the five codes from coders 20, 22, 24, 26, 28 and selects the smallest code length for output for that data block. The process is repeated for all 8 blocks in input data 12. Then the 8 selected codes are output as output compressed binary data 14.

The 5 coders are same coder 20, Gaussian coder 22, Laplace coder 24, delta coder 26, and copy coder 28. Each coder outputs a tag identifying the code type (same, Gaussian, Laplace, delta, or copy) and then the encoded data. For each data block, optimal code selector 30 selects the code with the smallest length and discards the other 4 codes.

Same coder 20 generates its code by generating the tag for same coding, 000, and then attaching the 8-bit data byte that is the same for all 8 bytes in the data block. So the code length is 11 bits for same coder 20. The same data block has been compressed to 17% or its original size, from 64 bits down to 11 bits.

Copy coder 28 generates its code by generating the tag for copy coding, 001, and then attaching the 8 bytes of data in the block. The copy code block has been expanded by 3 bits, or a compression ratio of 105%.

Rather than have all 5 coders 20, 22, 24, 26, 28 in parallel, same coder 20 may be checked first to determine if all 8 bytes are the same. When any of the 8 bytes differs, then same coder 20 is halted and Gaussian coder 22, Laplace coder 24, and delta coder 26 are activated in parallel. The smallest code is selected and compared to the code length for copy coder 28 which is always 3 bits more than the input data length, or 3+64=67 bits. When the smallest code from Gaussian coder 22, Laplace coder 24, and delta coder 26 is larger than 67 bits, then copy coder 28 is activated to generate the copy code as the output code. Optimal code selector 30 may pipeline operation of coders 20-28 to implement this sequence where same coder 20 is activated first, then Gaussian coder 22, Laplace coder 24, and delta coder 26 in parallel, and finally copy coder 28 if needed.

Figure 5:
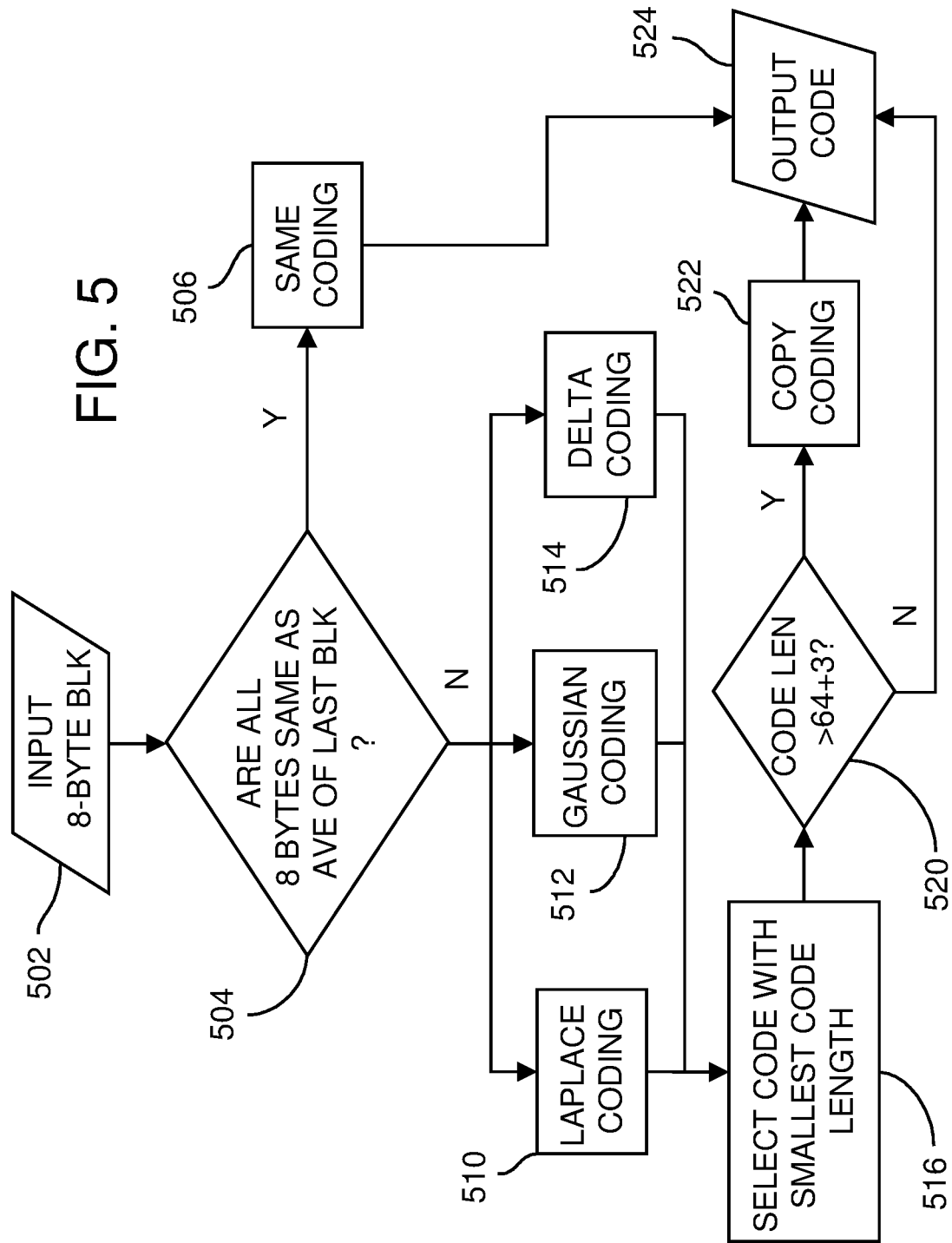
FIG. 5 is a flowchart of train-linking lossless data compression.

FIG. 5 is a flowchart of train-linking lossless data compression. Each data block is 64 bits or 8 bytes, with 8 data values. The 8-byte block is input, step 502, and examined to see if all 8 data values are the same. When all 8 data values are the same, step 504, then same coding is used to code the data block, step 506. This is the most efficient code when all eight data values are the same, since the compression ratio is 17%. The same code is output for the block, step 524, and the process repeated for other blocks.

When the 8 data bytes are not all the same, step 504, then a less efficient code must be used. Laplace coding, step 510, generates a Laplace code for the block. The Gaussian coder generates a Gaussian code for the block, step 512. The delta coder generates a delta code for the block, step 514. These 3 codes can be generated in parallel. It is not known in advance which code will be the smallest. Then the code with the smallest length is selected, step 516. When this code length is not more than 3 bits over the original data, or 64+3=67 bits, step 520, then the selected code is output for this data block, step 524, and the process repeated for the next data block.

When this code length is more than 3 bits over the original data, or 64+3=67 bits, step 520, then the data expanded too much using either Laplace, Gaussian, or delta coding. These codes are discarded and the copy coder is used to generate the code for this data block, step 522. The code length for the copy code of the block is just the 3-bit tag more than the original data block size, or 67 bits. The copy code is output, step 524, and the process repeated for the next data block.

FIG. 6 shows encoded compressed data for Gaussian and Laplace coding. Delta coding uses Gaussian but changes the data values before Gaussian encoding. Output compressed binary data (FIG. 4, 14) has for each data block (8 bytes of original data) tag 42, which indicates the compression code type, that is followed by pairs of code headers 44 and code values 46. Code header 44 has a fixed length of 3 bits for Gaussian, but a variable length for Laplace coding. Code value 46 has a variable length that is specified by code header 44.

FIG. 7 is a table of tags for coding. Tag 42 can be 2 or 3 bits in length. A tag of 000 indicates that the data block is encoded using same coding. Same encoding only requires the 3 tag bits and 8 data bits for the entire 64-bit data block.

A tag value of 001 indicates that the data block is copy coded. A tag value of 01 identifies the data block as Gaussian. A tag value of 10 indicates Laplace coding is used for the block. Delta coding is identified by the tag of 11.

Copy, Gaussian, Laplace, and delta coded blocks each have as their compressed code one tag followed by 8 pairs of code header 44, code value 46, one pair for each original data byte in the original data block.

FIG. 8 is a table showing Gaussian coding. Gaussian coding table 50 shows the range of data values of the original data byte in the first column. For an original data byte of 0, the first row shows that code header 44 is 000, code value 46 is 0, and the code length is 3 bits.

For an original data byte value of 1, 2, 3, or 4, the second row shows that code header 44 is 001, followed by code value 46 of XX, where XX=00 is original data 1, XX=01 is for original data 2, XX=10 is for original data 3, and XX=11 is for original data 4. XX=D−1, where D is the original data byte value in the input data stream. The code length is 5, and the code is 001XX.

For an original data byte value of 5, 6, 7, or 8, the third row shows that code header 44 is 010, followed by code value 46 of XX, where XX=00 is original data 5, XX=01 is for original data 6, XX=10 is for original data 7, and XX=11 is for original data 8. XX=D−5, where D is the original data byte value in the input data stream. The code length is 5, and the code is 010XX.

For an original data byte value between 9 and 16, the fourth row shows that code header 44 is 011, followed by code value 46 of XXX, where XXX=000 is original data 9, XXX=001 is for original data 10, XXX=010 is for original data 11, etc., and XXX=111 is for original data 16. XX=D−9, where D is the original data byte value in the input data stream. The code length is 6, and the code is 011XXX.

Some other rows are for data ranges 17-24, 25-40, 41-72, which have code lengths of 6, 7, and 8 bits, respectively.

For an original data byte value between 73 and 255, the last row shows that code header 44 is 111, followed by code value 46 of XXXXXXXX, where XXXXXXXX=00000000 is original data 73, XXXXXXXX=00000001 is for original data 74, XXXXXXXX=00000010 is for original data 75, etc., and XXXXXXXX=11111111 is for original data 255. XX=D−73, where D is the original data byte value in the input data stream. The code length is 11, and the code is 111XXXXXXXX.

FIG. 9 is a table showing Laplace coding. Laplace coding table 52 shows the range of data values of the original data byte in the first column. For an original data byte of 0, the first row shows that code header 44 is 0, code value 46 is null, and the code length is 1 bit. Code value 46 is not present for input data values of 0 and 255 for Laplace coding.

For an original data byte value of 1 or 2, the second row shows that code header 44 is 01, followed by code value 46 of X, where X=0 is original data 1, X=1 is for original data 2. XX=D−1, where D is the original data byte value in the input data stream. The code length is 3, and the code is 01X.

For each following row in Laplace coding table 52, code header 44 increases by one bit and code value 46 increases by 1 bit, so the code length increases by 2 bits for each successive row. Larger input data values consume more code bits for Laplace than for Gaussian. However, the maximum input value of 255, has a code length of 8, which is less than the code length of 11 for Gaussian with an input value of 255. Thus Laplace coding is efficient at coding maximum values.

Figure 10:
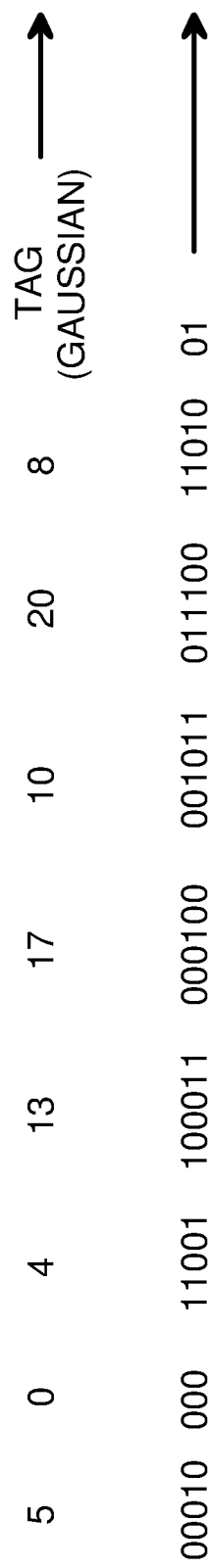
FIG. 10 is a diagram of a Gaussian-coded bitstream.

FIG. 10 is a diagram of a Gaussian-coded bitstream. This bitstream is read from right to left in this example diagram. The first bits read, 1 then 0, are the tag 01 that indicates that this block is Gaussian encoded.

The next bits are 11010, which have a code header of 010 followed by a code value of 11, which is for data value 8, third row of FIG. 8. Next data value 20 is encoded by code header 100 followed by code value of 011, fifth row of FIG. 8. Then data value 10 is encoded by code header 011 and code value 001, fourth row of FIG. 8. Data values 17 and 13 are similarly coded as 6-bit lengths. Then input data 4 uses a 5-bit length of code header 001 and code value 11, second row of FIG. 8. Input data value 0 is a 3-bit code with code header 000 and no code value. Finally input value 5 is encoded by a 5-bit code of code header 101 and code value 00, third row of FIG. 8.

The eight input data values 8, 20, 10, 17, 13, 4, 0, 5, are encoded by a total of 44 bits. The compression ratio is 44/64=69%. While compression of neural network weights has been described, the compressor may be used for other applications and data other than neural network weights may be compressed. For example, data for high-frequency stock trading may benefit from the low latency of the data compressor.

Alternate Embodiments

Several other embodiments are contemplated by the inventors. For example while 8-byte input blocks have been described, other blocks or symbol sizes could be substituted, such as 16-byte blocks, or blocks with 16 symbols. A 128-byte block could have 16 8-bit symbols, or could have 8 16-bit symbols. Many modifications and transformations of encoding schemes may be substituted.

While graphs and plots have been shown and described for better understanding by a human reader, a computer system may use a table or other data structure to implement these plots or graphs. A table can be a computer-implemented plot.

Delta coder 26 may subtract the average value of the prior block to get the delta values. When there is no prior block, the average may be set to zero. The difference or delta values may then be encoded using Gaussian coder 22 or using Laplace coder 24 or with some other code.

Various parameters may be expressed in a variety of ways and variations. For example, the compression ratio could be defined to be 100% for a non-compressible file and be 20% for a file that is 80% smaller when compresses, or could be defined to be 20% for a file that is only 20% smaller when compressed. Other statistics could likewise be altered, redefined, shifted, transformed, etc.

Various block sizes and symbol sizes could be used. The block size could be fixed or variable. An 8-bit input symbol (byte) and an 8-byte block are just one of many possibilities. Symbol values may be encoded as binary, two's complement, or in other encoding codes.

The codes used by Gaussian coder 22, Laplace coder 24, and delta coder 26 may be combined into a single code that the inventors refer to as Group Symbol Coding. Two flag bits indicate the number of code value bits that follow. For example, flag bits 00 have no code value bits, and encode a data input value of 0. For data values of 1 to 4, flag bits 01 have 2 code value bits. Data input values of 5 to 20 have flag bits set to 10 and are followed by 4 code value bits. Data input values 21 to 276 have flag bits set to 11 and have 8 code value bits. Code lengths are 2, 4, 6, or 10 bits. Group Symbol Coding can use fewer bits than Golomb coding for a better compression ratio, without a loop bit or table. Different data distributions may be coded with Group Symbol Coding.

Some embodiments may not use all components. Additional components may be added. Various components may be implemented in a variety of technologies, using various combinations of software, hardware, firmware, routines, modules, functions, etc. The train-linking compressor might be implemented as a program module, or in an Application-Specific Integrated Circuit (ASIC) or other hardware to increase processing speed and lower power consumption.

Terms such as left, right, up, down, are relative and can be flipped, rotated, transformed, or transposed in various ways. Adders may add complement values to implement subtraction. Subtraction and addition thus can be used interchangeably.

Various interleaving and mapping schemes could alter the actual storage locations to optimize bandwidth or other design parameters. Many memory arrangements, both physical and logical, are possible. Various parallel processing techniques may be used that perform the basic operations described here in a serial fashion for easier understanding.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A train-linking data compressor comprising:
   an input for receiving an input data block, the input data block having a plurality of data values;
   a same-value checker that examines the plurality of data values and outputs a same-value code when the plurality of data values all have a same data value;
   a plurality of coders, each coder in the plurality of coders receiving the input data block and each generating a compressed code for the input data block, the compressed code having a code length;
   an optimal code selector that examines the code length from each coder in the plurality of coders, and outputs as a selected compressed code the compressed code for a coder in the plurality of coders that generates a smallest of the code length;
   a length comparator that signals an uncompressible block when the code length of the selected compressed code is larger than a threshold length, the threshold length being a length of the input data block plus a tag length;
   a copy coder that generates a copy code by generating a tag followed by the input data block when the length comparator signals the uncompressible block; and
   a compressed code output that, when the same-value code is not output, outputs the selected compressed code from the optimal code selector when the uncompressible block is not signaled, and that outputs the copy code when the uncompressible block is signaled,
   whereby an optimal compressed code is output for the input data block.

2. The train-linking data compressor of claim 1 wherein the plurality of coders further comprises:
   a Gaussian coder for coding an input data block having the plurality of data values in a Gaussian distribution;
   a Laplace coder coding an input data block having the plurality of data values in a Laplace distribution.

3. The train-linking data compressor of claim 2 wherein the plurality of coders further comprises:
   a delta coder having a delta generator that generates a plurality of differences of the plurality of data values with an average value, the delta coder generating the compressed code from the plurality of differences.

4. The train-linking data compressor of claim 3 wherein the average value is an average of the plurality of data values of a prior input data block.

5. The train-linking data compressor of claim 2 wherein the compressed code comprises a tag and a plurality of compressed data codes, wherein a compressed data code for a middle data value comprises a code header and a code value, wherein the code header indicates a number of bits in the code value;

wherein a compressed data code for a zero value comprises a code header without a code value.

6. The train-linking data compressor of claim 5 wherein a compressed data code for a maximum value generated by the Laplace coder comprises a code header without a code value.

7. The train-linking data compressor of claim 6 wherein the code header generated by the Gaussian coder has a fixed number of bits while the code header generated by the Laplace coder has a variable number of bits.

8. The train-linking data compressor of claim 7 wherein the code header generated by the Laplace coder has a variable number of bits that increases for larger data values in the input data block.

9. The train-linking data compressor of claim 8 wherein the tag identifies when the compressed code is generated by the Gaussian coder and when the compressed code is generated by the Laplace coder.

10. The train-linking data compressor of claim 9 wherein the same-value code is a tag followed by the same data value detected by the same-value checker.

11. The train-linking data compressor of claim 10 wherein the input data block is a fixed-length block having the plurality of data values, wherein the plurality of data values comprises N data values, wherein N is a whole number of at least 8.

12. A computer-implemented method for compressing data comprising:
examining an input block of data having a plurality of input data values to determine when the plurality of input data values all are equal to a same data value;
when the plurality of input data values are all equal to the same data value, generating a compressed data code by generating a tag indicating a same data code type and attaching the same data value to the tag;
when the plurality of input data values are not all equal to the same data value:
generating a Gaussian code from the plurality of input data values of the input block, the Gaussian code having a Gaussian code length;
generating a Laplace code from the plurality of input data values of the input block, the Laplace code having a Laplace code length;
generating a delta code from the plurality of input data values of the input block, the delta code having a delta code length;
comparing code lengths of the Gaussian code, the Laplace code, and the delta code;
selecting the Gaussian code as a selected code when the Laplace code and the delta code have longer code lengths than the Gaussian code length;
selecting the Laplace code as the selected code when the Gaussian code and the delta code have longer code lengths than the Laplace code length;
selecting the delta code as the selected code when the Gaussian code and the Laplace code have longer code lengths than the delta code length;
comparing a selected code length of the selected code to a threshold length;
when the selected code length is less than the threshold length, outputting the selected code as the compressed data code;
when the selected code length is more than the threshold length, generating the compressed data code as the input block of data with a tag indicating a non-compressed block;
whereby the input block is compressed into the same data value and the tag, or into the compressed data code, or the input block of data is output with a tag indicating a non-compressed block.

13. The computer-implemented method for compressing data of claim 12 further comprising:
outputting the compressed data code to a computer memory device.

14. The computer-implemented method for compressing data of claim 12 wherein generating the Gaussian code comprises generating a tag indicating the Gaussian code type and a plurality of data codes, each data code for an input data value in the plurality of input data values.

15. The computer-implemented method for compressing data of claim 14 wherein each data code for a non-zero input data value comprises a code header and a code value, the code header indicating a number of bits in the code value.

16. The computer-implemented method for compressing data of claim 15 wherein the code header has a fixed number of bits when generated for the Gaussian code, but has a variable number of bits when generated for the Laplace code.

17. A multi-mode data compression system comprising:
an input for receiving an input data block;
a same coder for generating a same code when all data values in the input data block have a same data value, the same code having a tag indicating a same code type followed by the same data value;
a Gaussian coder for generating a Gaussian code, the Gaussian code having a tag indicating a Gaussian code type and a plurality of data codes, each non-zero data code having a code header and a code value, wherein the code header has a fixed number of bits that indicates a number of bits in the code value, wherein the number of bits in the code value increase for groups of successively larger data values;
a Laplace coder for generating a Laplace code, the Laplace code having a tag indicating a Laplace code type and a plurality of data codes, each intermediate data code having a code header and a code value, wherein the code header indicates a number of bits in the code value, wherein the number of bits in the code header and in the code value increase for groups of successively larger data values;
wherein each intermediate data code is for a data value that is not zero and is not a maximum data value;
a delta coder for generating a delta code, the delta coder subtracting a base value from each data value in the input data block to generate delta values, wherein the delta coder generates the delta code with a tag indicating the delta code type and an encoding of the delta values;
wherein the Gaussian code has a Gaussian code length;
wherein the Laplace code has a Laplace code length;
wherein the delta code has a delta code length;
a length comparator that compares the Gaussian code length, the Laplace code length, the delta code length, and a threshold length, and outputs a smallest code length;
a copy coder that generates a copy code by attaching a tag indicating a copy code type to the input data block, the copy code having the threshold length; and an optimal code selector that selects the same code when all data values in the input data block have the same data value, and when all data values in the input data block do not have the same data value outputs the Gaussian code when the Gaussian code length is the smallest code length, the Laplace code when the Laplace code length is the smallest code length, the delta code when the delta code length is the smallest code length, or the copy code when the threshold length is the smallest code length.

18. The multi-mode data compression system of claim 17 wherein a zero data code has the code header without having a code value.

19. The multi-mode data compression system of claim 18 wherein a maximum data code for the Laplace code has the code header without having a code value.

20. The multi-mode data compression system of claim 17 wherein the input data block comprises 8 data values and each data value comprises 8 bits.

* * * * *